United States Patent
Chen et al.

(10) Patent No.: US 9,068,326 B2
(45) Date of Patent: Jun. 30, 2015

(54) AUTOMATIC SENSING SYSTEM AND METHOD FOR USE WITH A PLUMBING FIXTURE

(75) Inventors: Zhongmin Chen, Shanghai (CN); Pengcheng Gao, Shanghai (CN); Dehua Xiong, Shanghai (CN)

(73) Assignee: SHANGHAI KOHLER ELECTRONICS, LTD., Shanghai (CN)

( * ) Notice: Subject to any disclaimer, the term of this patent is extended or adjusted under 35 U.S.C. 154(b) by 842 days.

(21) Appl. No.: 13/340,262

(22) Filed: Dec. 29, 2011

(65) Prior Publication Data

US 2012/0174306 A1 Jul. 12, 2012

Related U.S. Application Data

(63) Continuation-in-part of application No. PCT/CN2010/074216, filed on Jun. 22, 2010.

(30) Foreign Application Priority Data

Jun. 30, 2009 (CN) .......................... 2009 1 0054199

(51) Int. Cl.
*E03D 13/00* (2006.01)
*E03C 1/05* (2006.01)
(Continued)

(52) U.S. Cl.
CPC ................ *E03C 1/057* (2013.01); *E03D 13/00* (2013.01); *G01S 17/026* (2013.01); *H03K 17/941* (2013.01); *H03K 2217/0036* (2013.01);
(Continued)

(58) Field of Classification Search
CPC ..................................... E03C 1/00; E03D 5/10

USPC ....................................................... 4/300–442
See application file for complete search history.

(56) References Cited

U.S. PATENT DOCUMENTS 5,224,685 A 7/1993 Chiang et al.
5,772,291 A 6/1998 Byrd et al.
(Continued)

FOREIGN PATENT DOCUMENTS

CN 1796674 7/2006
CN 1796674 A 7/2006
(Continued)

OTHER PUBLICATIONS

International Preliminary Report on Patentability for International Application No. PCT/CN2010/074216, mail date Jan. 12, 2012, 8 pages.
(Continued)

*Primary Examiner* — Lori Baker
(74) *Attorney, Agent, or Firm* — Foley & Lardner LLP (57) ABSTRACT

An automatic sensing system and a detecting method for use with plumbing equipment in the kitchen and washroom are shown and described. The automatic sensing system includes an ambient light sensor for detecting the ambient light intensity around the equipment. The system further includes a detecting sensor for detecting whether user enters the detected area. The system also includes a controller which controls the equipment based on detected signals from the detecting sensor. The controller is configured to start or change the state of the detecting sensor according to a detected value change of the ambient light intensity. The automatic sensing system advantageously saves power consumed by the detecting sensor when the ambient light sensor does not indicate use by the equipment.

19 Claims, 5 Drawing Sheets

(51) Int. Cl.
*G01S 17/02* (2006.01)
*H03K 17/94* (2006.01)
*G01S 17/88* (2006.01)
*G01S 7/486* (2006.01)

(52) U.S. Cl.
CPC ....... *H03K2217/94106* (2013.01); *G01S 17/88* (2013.01); *G01S 7/4868* (2013.01)

(56) References Cited

U.S. PATENT DOCUMENTS

| | | |
|---|---|---|
| 5,777,229 A | 7/1998 | Geier et al. |
| 5,819,336 A | 10/1998 | Gilliam et al. |
| 2002/0104159 A1 | 8/2002 | Nishioka |
| 2006/0124883 A1 | 6/2006 | Bailey |
| 2006/0237674 A1 | 10/2006 | Iott et al. |
| 2007/0057215 A1 | 3/2007 | Parsons et al. |
| 2008/0100185 A1 | 5/2008 | Lewis |

FOREIGN PATENT DOCUMENTS

| | | |
|---|---|---|
| JP | 09-195336 | 7/1997 |
| JP | 195336 A | 7/1997 |
| JP | 2005-098890 | 4/2005 |
| JP | 2005098890 A | 4/2005 |
| WO | WO2011000275 A1 | 1/2011 |

OTHER PUBLICATIONS

European Search Report for Application No. EP10793570 mailed Nov. 16, 2012; 6pgs.
State Intellectual Property Office of China; International Search Report and Written Opinion; PCT/CN2010/074216; Sep. 30, 2010; 30 pages, including English translation.

AUTOMATIC SENSING SYSTEM AND METHOD FOR USE WITH A PLUMBING FIXTURE

CROSS-REFERENCE TO RELATED APPLICATIONS

This application is a continuation-in-part of PCT/CN2010/074216, filed Jun. 22, 2010, which claims the benefit of CN200910054199.5, filed Jun. 30, 2009. PCT/CN2010/074216 and CN200910054199.5 are hereby incorporated by reference in their entireties.

FIELD

The present invention relates to an automatic sensing system and method for use with a plumbing fixture. The present invention more particularly relates to an automatic sensing system and method for controlling an automatic sensing faucet or other equipment in the kitchen or washroom.

BACKGROUND

Sensors used for controlling the automatic sensing faucets and other equipment (such as urinals or toilets) in the kitchen or washroom are usually infrared sensors. A traditional infrared sensor comprises an infrared emitting device and infrared receiving device. The traditional infrared sensor conventionally continuously emits infrared light to the detected area at regular time intervals, such as emitting once every 0.3 second, and said infrared receiving device receives the reflected infrared signals. By checking the intensity of the received infrared signals, a controller determines whether the equipments in the kitchen or washroom are in use. The use determination is used to control the equipment, for example, by the opening or closing of a valve for the automatic sensing faucet or for the flushing of the urinals. The following is an example of how such a conventional infrared sensor system is used for controlling the faucet. When the infrared sensor system detects that the user enters the detected area, the valve of the faucet is opened to discharge water. When the infrared sensor detects that the user has left the detected area, the valve of the faucet is closed to stop the water flow. When such an infrared sensing system is used for controlling the urinal the following is an example of the behavior: when the infrared sensor detects that the urinal is in use, the water discharging valve is opened for the first flush and when the infrared sensor detects that the user has left the detected area, the water discharging valve is opened for the last flush.

As the traditionally automatic sensing faucets use direct current power, how to reduce the power consumed by the infrared sensor (and thereby extend the life of the battery) becomes a challenging technical problem. In order to save power, some existing systems attempt to improve upon of the traditional infrared sensor systems described above. In such existing systems, during normal use the infrared sensor emits infrared light at a relatively low frequency for detection. If the system determines that a user is using the equipment in the kitchen or washroom, the infrared sensor emits infrared light at higher frequency. Such existing methods are not effective at saving power and are inconvenient to the user. For example, when the infrared sensor is used to control the faucet, the user may have to wait for a long time before the water comes out from the faucet due to the relatively low frequency infrared light sampling. What is needed is an automatic sensing system which is more effective and consumes less power.

SUMMARY

An object of embodiments of the present invention is to provide an automatic sensing system and detecting method thereof which has lower power consumption and precise detecting.

An object of embodiments of the present invention is realized by the following first technical solution. An automatic sensing system used in the kitchen or washroom includes an ambient light sensor which detects the ambient light intensity around the equipment, a detecting sensor for detecting whether the user enters the detected area of said detecting sensor, and a controller which controls the related equipment based on detected results of the detecting sensor. Based on the value changes of the ambient light intensity, said controller is configured to start the detecting sensor for conducting its user detection.

The ambient light sensor may be a photosensitive sensor.

The photosensitive sensor may be a passive photosensitive diode.

The detecting sensor may be an infrared sensor. The infrared sensor may include an infrared emitting unit for emitting infrared light to the detected area and an infrared receiving unit for receiving the reflected infrared signals.

The automatic sensing system may further include an ambient light intensity detecting unit. The ambient light intensity detecting unit may include a current-voltage transferring circuit connected to the ambient light sensor. The current-voltage transferring circuit may include an operating amplifier for outputting voltage.

The current-voltage transferring circuit may include a capacitance which is in parallel to the operating amplifier to prevent the self-oscillation of the circuit.

In another embodiment, an object of the present invention is realized by the following second technical solution. An automatic sensing system used in the kitchen or washroom includes an ambient light sensor which detects the ambient light intensity around equipment in the kitchen or washroom. The system includes a detecting sensor for detecting whether a user enters the detected area of said detecting sensor. The system further includes a controller which controls the equipment based on detected results of the detecting sensor. Based on the values of the ambient light intensity and the value changes of the ambient light intensity, said controller starts the detecting sensor for making the user detection.

The ambient light sensor may be a photosensitive sensor.

The photosensitive sensor may be a passive photosensitive diode.

The detecting sensor may be an infrared sensor. The infrared sensor may include an infrared emitting unit for emitting infrared light to the detected area. The infrared sensor may further include an infrared receiving unit for receiving the reflected infrared signals.

The automatic sensing system may further include an ambient light intensity detecting unit. The ambient light intensity detecting unit may include a current-voltage transferring circuit connected to the ambient light sensor. The current-voltage transferring circuit may include an operating amplifier for outputting voltage.

The current-voltage transferring circuit may include a capacitance which is in parallel to the operating amplifier to prevent the self-oscillation of the circuit.

In another embodiment, an object of the present invention is realized by the following third technical solution. An automatic detecting method for controlling related equipments in the kitchen or washroom includes sampling ambient light at regular time intervals and detecting the values of the ambient light intensity. The method further includes starting the detecting sensor if the value change of the ambient light intensity is greater than a predetermined limited value. Once started, the detecting sensor can be used to judge whether user enters the detected area of said detecting sensor or not.

The sampling of ambient light may be performed by a photosensitive sensor.

A passive photosensitive diode may be used as the photosensitive sensor.

The detecting sensor may be an infrared sensor. The detecting sensor may include an infrared emitting unit for emitting infrared light to the detected area and an infrared receiving unit for receiving the reflected infrared signals.

An object of the present invention is realized by the following fourth technical solution. An automatic detecting method for controlling equipment in the kitchen or washroom includes the steps of sampling ambient light at regular time intervals and detecting the values of the ambient light intensity. The method further includes starting the detecting sensor if a value of the ambient light intensity is within a range of predetermined comparative threshold values and a value change of the ambient light intensity is greater than a predetermined limited value. Once started, the detecting sensor is used to detect whether user enters the detected area of said detecting sensor or not.

The sampling of ambient light may be performed by a photosensitive sensor.

The passive photosensitive diode may be used as the photosensitive sensor.

The detecting sensor may be an infrared sensor controlled to emits the infrared light at a normal working frequency to make the user detection judgment.

The automatic detecting method may include a dim light state judgment. The dim light state judgment may include determining that the ambient light is under the dim light state if the value of the ambient light intensity is less than a threshold.

Under the dim light state, the frequency of the infrared judgment may be controlled to be lower than the normal working frequency.

The automatic detecting method may also include a strong light state judgment. The strong light state judgment may include determining that the ambient light is under the strong light state when the ambient light intensity is greater a threshold value.

In the strong light state, the infrared judgment frequency may be controlled to be greater than the normal working frequency.

In the strong light state, the infrared judgment frequency may be equal to the normal working frequency.

Compared with the prior art, by using passive or low power consumption ambient light sensor to pre-detect, and then starting the detecting sensor, which consumes more power, according to the value change of the ambient light intensity, power consumption will be reduced. Once started, the detecting sensor is used to detect the usage state for controlling the kitchen or washroom equipment.

DETAILED DESCRIPTION

Figure 1:
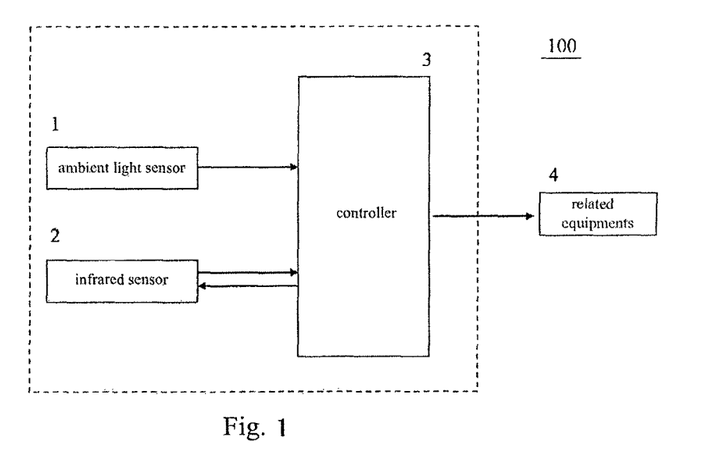
FIG. 1 is a block diagram of an automatic sensing system according to an exemplary embodiment of the present invention.

With reference to the exemplary embodiment of FIG. 1, the automatic sensing system 100 is used for controlling the automatic sensing faucet or other related equipments in the kitchen or washroom, such as urinals or toilets. The automatic sensing system 100 is shown to include an ambient light sensor 1, an infrared sensor 2 and a controller 3. The ambient light sensor 1 detects the value change of the ambient light intensity around the related equipment 4 in the kitchen or washroom and sends the detected results to controller 3. According to the value (or values) change of the ambient light intensity, controller 3 decides whether the infrared sensor 2 should be started. In another embodiment, the controller may determine whether the infrared sensor 2 should be changed to a working state from a resting state. Once the infrared sensor 2 is started (or changed to a working state), it emits infrared light to detect if targets (such as human body or hands) enter the detected area. Said infrared sensor 2 sends the results of the detection (or lack thereof) to the controller 3. The controller 3 may process the reflected infrared signals to conduct the detection. Controller 3 can use the reflected infrared signals received from the infrared sensor or a detection result received from the infrared sensor to decide further actions. For example, in response to infrared signals or a detection result that indicates a hand is near the infrared sensor, the controller 3 can control the faucet valve to discharge water, can close the faucet valve to stop water, or can control other related equipment in the kitchen or washroom that is associated with the automatic sensing system.

The ambient light sensor 1 may be a photosensitive sensor used for detecting the ambient light. The ambient light sensor 1 could more particularly be a photosensitive diode, a photosensitive transistor, or a photosensitive resistive element. In an exemplary embodiment, the ambient light sensor 1 is a photosensitive diode. A photosensitive diode is a kind of semiconductor configured to convert light energy into electric energy. Photosensitive diodes often make use of a silicon photoelectric cell. In an exemplary embodiment, the photosensitive diode is a passive sensing element (i.e., a passive photosensitive diode), which doesn't consume energy. Compared with photosensitive transistor or a photosensitive resistive element, a photosensitive diode may be used to reduce energy consumption. However, in some embodiments (e.g., where the capacity of the battery serving the ambient light sensor is sufficient), the ambient light sensor 1 could be a photosensitive transistor or a photosensitive resistive element.

Infrared sensor 2 includes an infrared emitting unit and an infrared receiving unit. An LED may be used as infrared emitting unit. The infrared emitting unit emits infrared light to the detected area. The infrared receiving unit receives the infrared signals reflected from the detected area and sends the reflected signals to the controller 3 for processing.

Controller 3 is connected with the ambient light sensor 1, infrared sensor 2 and the operating mechanism of the related equipment 4 in the kitchen or washroom. Controller 3 processes information (e.g., from the sensors 1 and 2) and controls the related operating mechanism to perform the related operations (e.g., open and close valves) in response to the processing.

Exemplary operating procedures of the automatic sensing system 100 of the present invention are as follows. Ambient light sensor 1 detects the value and/or value change of ambient light intensity at regular time intervals. In one example, the ambient light sensor 1 is caused to detect ambient light once every 0.3 seconds.

When no user is nearby and affecting the detected ambient light, the ambient light intensity detected by said ambient light sensor 1 doesn't change, or it changes slowly. In response to recognizing such a condition, the controller 3 may turn the infrared sensor 2 off or reduce the detection rate of the infrared sensor. Accordingly, when no or low ambient light changes are occurring, the infrared sensor 2 does not operate or emits infrared light to its detected area at slower intervals of time. For example, the controller can cause the infrared sensor 2 to emit an infrared pulse once every 2 seconds rather than once every 0.5 seconds. When longer intervals of time are caused to exist between infrared emissions, the present application may refer to such a state as a "resting state." The infrared sensor 2 may continue to work while in the resting state, but merely is slightly slower to respond and uses less energy.

When the user approaches the related equipment 4 in the kitchen or washroom, the ambient light sensor 1 detects the ambient light intensity around the related equipment 4 changing suddenly. Controller 3 processes the received signals of the sudden value change of the ambient light intensity. Controller 3 can process the received signal by comparing the value change of the ambient light intensity to a predetermined limited value. For example, controller 3 may judge or determine whether the value change of the ambient light intensity is greater than the predetermined limited value or not. Once the controller 3 judges or determines that the value change of the ambient light intensity meets or exceeds the predetermined limited value, controller 3 can cause infrared sensor 2 to start to emitting infrared light to its detected area at a faster normal working frequency. According to an exemplary embodiment, the normal working frequency of infrared sensor 2 is an emission of infrared light once every 0.3 seconds. The infrared sensor 2 can be changed to the normal working frequency or state from the resting state based solely on the value change of the ambient light. In another embodiment of the present invention, in addition to judging whether the value change of the ambient light intensity meets the or exceeds the predetermined limited value, the absolute value of the ambient light intensity is also judged to determine whether it meets a predetermined value. For example, after determining that the intensity value is within the predetermined range of the comparative threshold values, the controller 3 may conduct the value comparison of the ambient light intensity to a predetermined limited value. Such logic is illustrated, for example, in FIG. 4.

The infrared emitting unit of said infrared sensor 2 emits infrared light to determine whether a user is reflecting the infrared light. The infrared receiving unit of the infrared sensor 2 sends the reflected signals to controller 3. The controller 3 processes the reflected infrared signals to control the related equipment 4 in the kitchen or washroom. For example, the controller 3 can cause the faucet to discharge water or to open the solenoid valve of a urinal for flushing.

When no one is positioned near the related equipment for use, the infrared sensor 2 is in a non-working state or resting state due to controller 3 detecting insufficient changes in ambient light. Only when the value change of ambient light intensity detected by ambient light sensor 1 meets the or exceeds a predetermined limited value, then the controller 3 causes infrared sensor 2 to be started to work (i.e., changes to the working state from the resting state). In an exemplary embodiment, the ambient light sensor 1 consumes no energy or little energy. Thus, compared with prior art, automatic sensing system 100 could reduce energy consumption. Further, using the value change of ambient light intensity as the standard for starting the infrared sensor may advantageously make the system of the present application more precise and reliable relative to the prior art.

Figure 2:
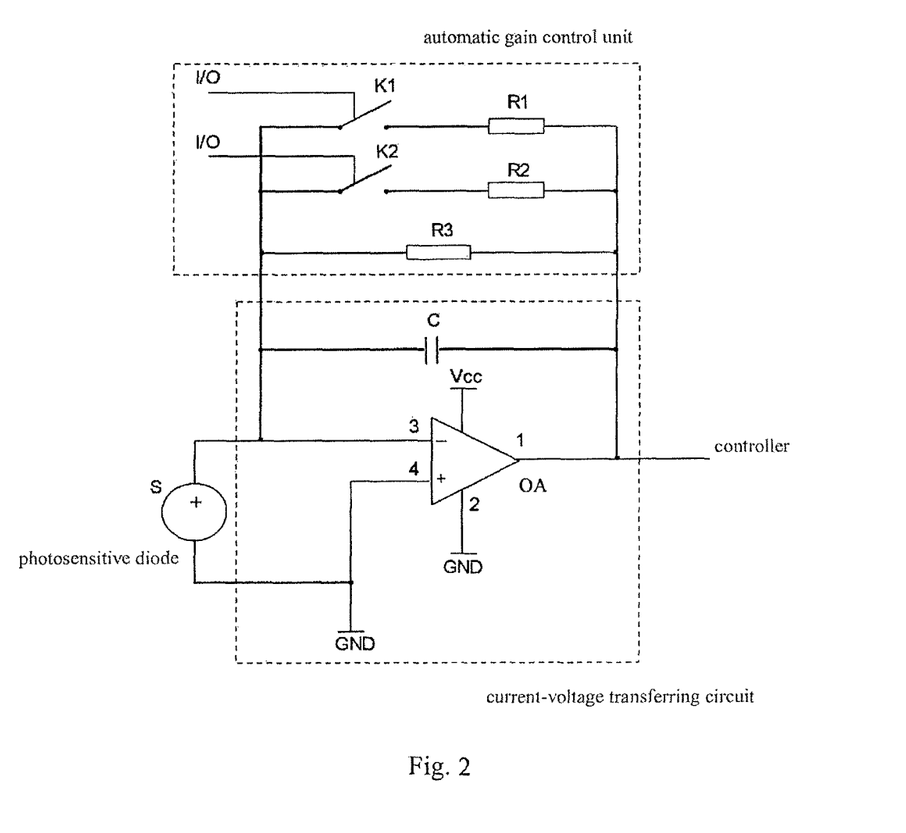
FIG. 2 is a partial schematic diagram of an electric circuit of the automatic sensing system according to an exemplary embodiment of the present invention.

Referring now to FIG. 2, an ambient light detecting unit is shown, according to an exemplary embodiment. Relative to FIG. 1, the ambient light detecting unit of FIG. 2 can be included within the ambient light sensor 1 shown in FIG. 1. In the embodiment of FIG. 2, the voltage values corresponding to the ambient light intensity are used as the values of the ambient light intensity. The ambient light intensity detecting unit may include a current-voltage transferring circuit (shown on FIG. 2). The photosensitive diode converts the ambient light intensity into electric current signals for output. The stronger the ambient light becomes, the greater the electric current from the photosensitive diode becomes. The ambient light intensity detecting unit of FIG. 2 converts the current signals output by the photosensitive diode into voltage signals. The voltage signals are sent to the controller for further processing. The controller, for example, processes the voltage signals as values of ambient light intensity. The current-voltage transferring circuit of FIG. 2 is shown to include an operating amplifier OA used for converting the current to voltage and a capacitance C which is parallel to the operating amplifier OA to prevent self-oscillation of the circuit. In an exemplary embodiment, an ST Electronics TS941 op-amp is used as the operating amplifier OA. In an exemplary embodiment, the OA's working voltage is as low as 2.5V and its working current is as low as 1.2 microamperes.

The circuit of FIG. 2 is also shown to include an automatic gain control unit. Using the automatic gain control unit, the detected ambient light signals are adjusted to be within a range where the detected ambient light signals can be more easily identified or precisely processed. The automatic gain control unit is shown as a circuit including a first analog switch K1, a second analog switch K2, a first resistance R1 which is in series with the first analog switch K1, a second resistance R2 which is in series with the second analog switch K2, and third resistance R3 which is parallel to R1 and R2. The automatic gain control unit can change the feedback resistance by controlling K1 and K2, thereby conducting gain control on the output of the current-voltage transferring circuit.

Using the automatic gain control unit of FIG. 2, the automatic gain control could be divided into four levels. In the first level, analog switches K1 and K2 are switched on, and R1, R2 and R3 are parallel to each other. In the second level, the first analog switch K1 is switched on and second switch K2 is switched off and R1 and R3 form an electric path. In the third level, K1 is switched off and K2 is switched on and R2, R3 forms the electric path. In the fourth level, K1 and K2 are switched off and R3 forms an electric path.

In an exemplary embodiment, the resistance R1 is 470 kΩ, R2 is 2 MΩ and R3 is 20 MΩ. In such an embodiment, when analog switches K1 and K2 are switched on, the feedback resistance is about 380 kΩ; while K1 is switched on and K2 is switched off, the feedback resistance is about 470 kΩ; while K1 is switched off and K2 is switched on, the feedback resistance is about 1.8 MΩ; while K1, K2 are switched off, the feedback resistance is about 20 MΩ.

Although a four level embodiment is illustrated in FIG. 2, the automatic gain control of an automatic gain control unit could provide two levels of gain control or other multiple levels of gain control.

An exemplary operation of the automatic gain control unit of FIG. 2 is described as follows. The range (P2, P1) of comparative threshold values are set in advance. The first comparative threshold value may be named P1 and the second comparative threshold value may be named P2. When the voltage values associated with the ambient light intensity are greater than the first comparative threshold value P1, the feedback resistance is decreased and the gain is reduced. When the voltage values corresponding to the ambient light intensity are greater than the first comparative threshold value P1 and the gain has been the minimum, the ambient light is judged to be in the strong light state (e.g., a state associated with direct light).

When the voltage values corresponding to the ambient light intensity are less than the second comparative threshold value P2, the feedback resistance is increased and the gain is enhanced. When the voltage values corresponding to the ambient light intensity are less than the second comparative threshold value P2 and the gain has been at the maximum, the ambient light is judged to be in the dim light state (e.g., a state associated with a dark room).

While the ambient light is in the above-mentioned strong light or dim light state, the behavior of infrared sensor 2 is correspondingly adjusted by the controller 3. In dim light state or dark state (such as at night when the faucet or toilet are not frequently used), the controller adjusts the infrared emitting frequency to be less than the normal working frequency. The normal working frequency may cause infrared emissions once every 0.5 seconds or 0.8 seconds. In the dim light state, the controller may adjust the time period between infrared emissions to be longer than in the strong light state (e.g., between 0.5 seconds to 1 second). In the strong light state, the controller may cause the infrared emitting frequency to be greater than or equal to the normal working frequency. For example, in the strong light state, the infrared emitting frequency might be once every 0.2 seconds.

In one of the preferred embodiments of the present invention, the first comparative threshold value P1 is 80% of the highest voltage value of the circuit and the second comparative threshold value P2 is 20% of the highest voltage value of the circuit. By choosing the above-mentioned resistance and comparative threshold values, gain should only need to be adjusted during very high light or very low light. By distinguishing between the dim light state mode and strong light state, some embodiments of the present application are advantageously able to adjust for different conditions and to thereby improve reliability.

Some embodiments of the present application may detect between 0.5LUX and 1000LUX (e.g., using the gain adjustment circuitry/method described above), which could advantageously help satisfy most practical detection needs in the kitchen or washroom.

Figure 7A:
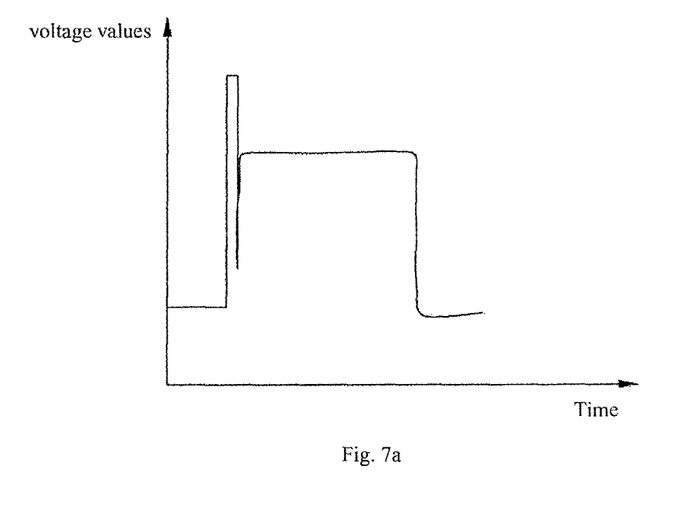
FIG. 7a is a graph of the value of the sampled ambient light intensity where the intensity is not disturbed by other lights.
Figure 7B:
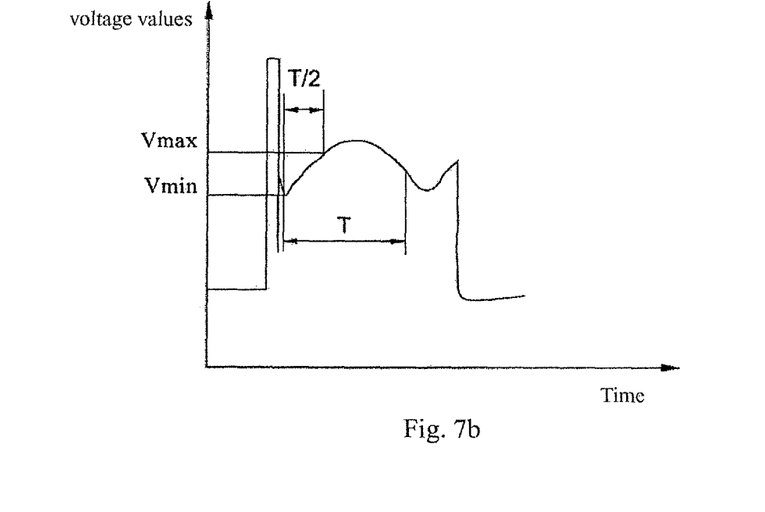
FIG. 7b is a graph of the value of the sampled ambient light intensity where the intensity is disturbed by other lights.
Figure 8:
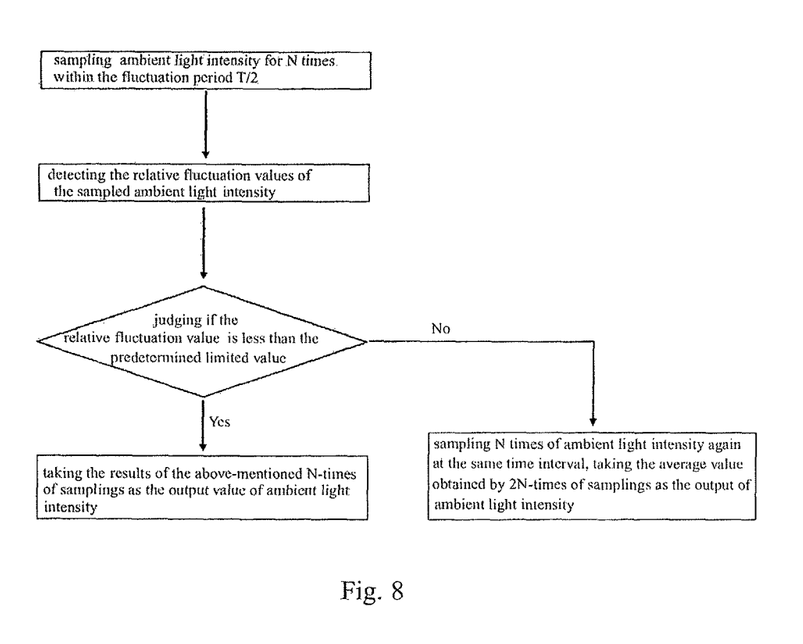
FIG. 8 is a flow chart of a method for preventing the disturbance of the ambient lighting sensor by industrial frequency light in the automatic detecting method of the present invention.

Referring now to FIGS. 7a, 7b, and 8, a method for preventing the ambient light detection of the present application from being disturbed by industrial lighting frequencies (e.g., as provided by a fluorescent lamp) is shown and described, according to an exemplary embodiment. As illustrated by the ambient light voltage to time graph of FIG. 7a, while automatic sensing system of the present invention is not disturbed by nearby industrial lights, the voltage values corresponding to sampled ambient light intensity may be relatively smooth. As illustrated by the ambient light voltage to time graph of FIG. 7b, when the system is disturbed by nearby industrial lights or other transient conditions, the voltage values corresponding to sampled ambient light intensity fluctuates. Such disturbances may lead to incorrect ambient light determinations. Embodiments of the present application may advantageously include a controller logic unit for reducing disturbances caused by industrial frequency lights. The controller logic unit for preventing the disturbance of the industrial frequency lights operates when the ambient light is sampled. The controller logic unit for preventing the disturbance of the industrial frequency lights is intended to cause the ambient light intensity values detected by ambient light sensor 1 to be more precise, thereby causing the performance of the whole system to be enhanced.

As shown on FIG. 8, an exemplary process for preventing the disturbance of the industrial frequency lights is shown. The disturbing period T of the disturbance of the industrial frequency light is often the half-wave of the industrial frequency (for example: 50 Hz/60 Hz). First, within the period T/2, the ambient light intensity is sampled for N times at regular time intervals. In an embodiment of the present invention, N is 5. Second, the relative fluctuation value $\Delta V$ of the sampled ambient light intensity is calculated. In an exemplary embodiment, the formula $\Delta V=(Vmax-Vmin)/((Vmax+Vmin)/2)$ is used to calculate the relative fluctuation value. Said Vmax and Vmin are the highest and the lowest voltage values corresponding to the ambient light intensity within the T/2 period. Third, it is judged whether the relative fluctuation value $\Delta V$ is less than the predetermined limited value W. If the relative fluctuation value $\Delta V$ is less than the predetermined limited value W, it is judged that the automatic sensing system is not disturbed by the industrial frequency light, and the average value of the results of the above-mentioned N times of samplings is taken as the output of the ambient light intensity. If the relative fluctuation value $\Delta V$ is not less than the predetermined limited value W, it is determined that the automatic sensing system is disturbed by the industrial frequency light. The ambient light will be sampled for N times again at the same time interval and the average value of the results of 2N times of samplings is taken as the output of the ambient light intensity. In an exemplary embodiment, said value W is 3%.

Embodiments of the present application having the feature for providing different ambient light calculations depending on whether the system is or is not disturbed by industrial frequency lights can advantageously save energy relative to a system that assumes no lighting disturbance.

Figure 3:
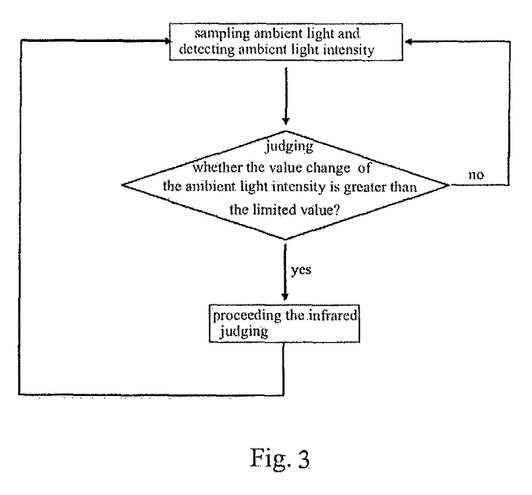
FIG. 3 is a flow chart of an exemplary automatic detecting method of the present invention.

Referring now to the flow chart of FIG. 3, an automatic detection method (e.g., for operation by the system of FIG. 1) is shown, according to an exemplary embodiment. In the first step, the ambient light is sampled and the value of the ambient light intensity is detected using one or more samples. With reference to FIGS. 1 and 2, the ambient light sensor 1 may sample the ambient light at regular time intervals and sends the voltage values corresponding to ambient light to controller 3 to be processed by the current-voltage transferring circuit of FIG. 2. The controller 3 may determine the value of the ambient light intensity in the processing. The time interval T1 for detecting the ambient light intensity may be, e.g., 0.3 seconds. In the second step, it is judged whether the value change of the ambient light intensity is greater than a predetermined limited value. As illustrated in FIG. 3, if the value change of the ambient light intensity is greater than predetermined limited value, the procedure enters the third step and starts the infrared sensor 2. If the value change of the ambient light intensity is not greater than the predetermined limited value, the procedure returns to the first step to sample the ambient light and detect ambient light intensity again.

In an exemplary embodiment, the predetermined limited value change of the ambient light intensity may be K. The judging step of FIG. 3 may depend on whether the value change of the ambient light intensity is greater than predetermined limited value change K two times continuously. If it is judged that there is sudden changed signal based on the value change of the ambient light intensity being greater than the predetermined limited value change K, then the procedure enters the third step. Otherwise, it is judged there is no sudden changed signal and the procedure returns to the first step to sample the ambient light and detect the values of ambient light intensity over again. In an exemplary embodiment, the predetermined limited intensity value change K is 5%.

Under some situations, such as when a user moves slowly, if the judgment is decided only based on the value change of the ambient light intensity, the judgment of FIG. 3 might fail as the intensity value change is not greater than the predetermined limited value change. Therefore, in other embodiments of the present invention, the judgment of the value change of the ambient light intensity may be based on samples spread over time intervals. For example, in some embodiments, the process of FIG. 3 may judge whether the value changes sampled within one, two, or several sampling periods or time intervals have changed.

As shown, the third step of FIG. 3 is proceeding with the infrared judgments for actual detection of the target (e.g., a user's hand). In the proceeding step, the infrared sensor 2 is started. Starting the infrared sensor may be or include changing the infrared sensor to the working state from the resting state. In an exemplary embodiment, the time period for the infrared judgment is 2 seconds and the working frequency is that infrared light is emitted once every 0.3 seconds. If it is detected that no user enters the detected area in the regulated judgment time period (e.g., the 2 second period), the infrared judgment stops, and the procedure returns to the first step to starts the ambient light detecting over again. If it is detected that the user enters the detected area, then the related equipment is controlled to work, such as opening or closing the valve of the faucet. After the operation of the equipment is completed, the infrared judgment stops, and the procedure returns to the first step to starts the ambient light intensity detecting over again.

Figure 4:
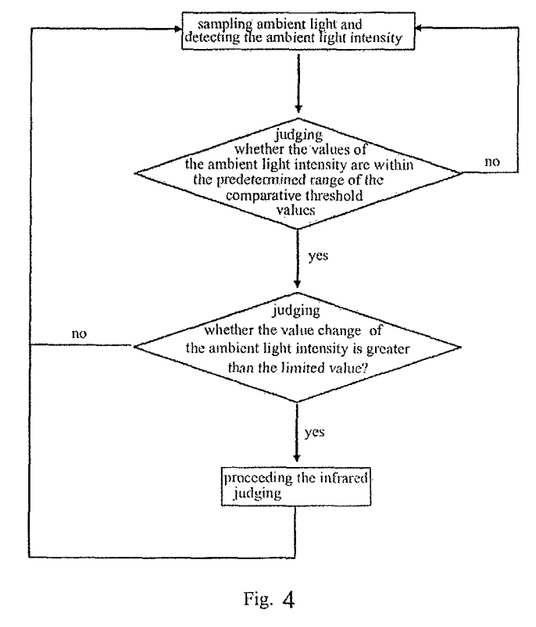
FIG. 4 is a flow chart of another exemplary automatic detecting method of the present invention.

Referring now to the flow chart of FIG. 4, an automatic detection method (e.g., for operation by the system of FIG. 1) is shown, according to another exemplary embodiment. In the first step, the ambient light is sampled and the value of the ambient light intensity is detected. The ambient light sensor 1 samples the ambient light at regular time intervals and sends the voltage values corresponding to ambient light to controller 3 to be processed by the current-voltage transferring circuit. The controller's processing may include detecting the value of the ambient light intensity using a received voltage value. The time interval T1 for detecting the ambient light intensity may be 0.3 seconds. In the second step, it is judged whether the value of the ambient light intensity is within the predetermined range of comparative threshold values. If the ambient light intensity goes beyond the range of the predetermined comparative threshold values, the procedure returns to the first step. If the ambient light intensity is within the predetermined range of threshold values, the procedure enters the third step.

As an example where the predetermined range of comparative threshold values includes P2 and P1, wherein P1 is the first comparative threshold value and P2 is the second comparative threshold value, the first comparative threshold value P1 may be 80% of the highest voltage value of the circuit and the second comparative threshold value P2 may be 20% of the highest voltage value of the circuit.

In the third step of FIG. 4, the controller judges whether the value change of the ambient light intensity is greater than the predetermined limited value change. If the value change of the ambient light intensity is greater than the predetermined limited value change, the procedure enters the fourth step and the infrared sensor is started to make an infrared judgment. If the value change of the ambient light intensity is not greater than the predetermined limited value change, the procedure returns to the first step to sample the ambient light and detect ambient light intensity over again.

As an example where the predetermined limited value change of the ambient light intensity is K, if two continued value changes of the ambient light intensity are greater than the predetermined limited value change K, it may be judged that there is sudden change signal, causing the procedure to enter the fourth step. Otherwise, it may be judged that there is no sudden change signal, causing the procedure to return to the first step to sample the ambient light and detect ambient light intensity over again. In an exemplary embodiment, the predetermined limited intensity value change K is 5%.

Although the above-mentioned value change of the ambient light intensity is the value change between two continuously detected values of the ambient light intensity in some embodiment, in other embodiments the judgment of the value change of the ambient light intensity may be based on the value change which is sampled within a period of time interval. In yet other embodiments the judgment of the value change of the ambient light may occur over two or more time intervals or sampling periods.

In the fourth step of the process shown in FIG. 4, the infrared judgment is caused to proceed for detecting the target (e.g., a hand near a faucet). The infrared sensor 2 is started in the fourth step of FIG. 4. Starting the infrared sensor may include changing the infrared sensor 2 to the working state from resting state. In an exemplary embodiment the time period for the infrared judgment is 2 seconds and the working frequency is once every 0.3 seconds. If it is detected that no user enters the detected area in the regulated judgment time period, the infrared judgment stops, and the procedure returns to the first step to start ambient light detecting over again. If it is detected that the user enters the detected area, the related equipment is controlled to work, such as by causing the opening or closing the valve of the faucet. After the equipment operation is completed, the infrared judgment stops, and the procedure returns to the first step to start ambient light intensity detecting over again.

Compared to FIG. 3, in the process of FIG. 4, the procedure of judging whether the value of the ambient light intensity is within the range of comparative threshold values is added. In some environments, the added step of FIG. 4 can advantageously make the judgment more precise.

Figure 5:
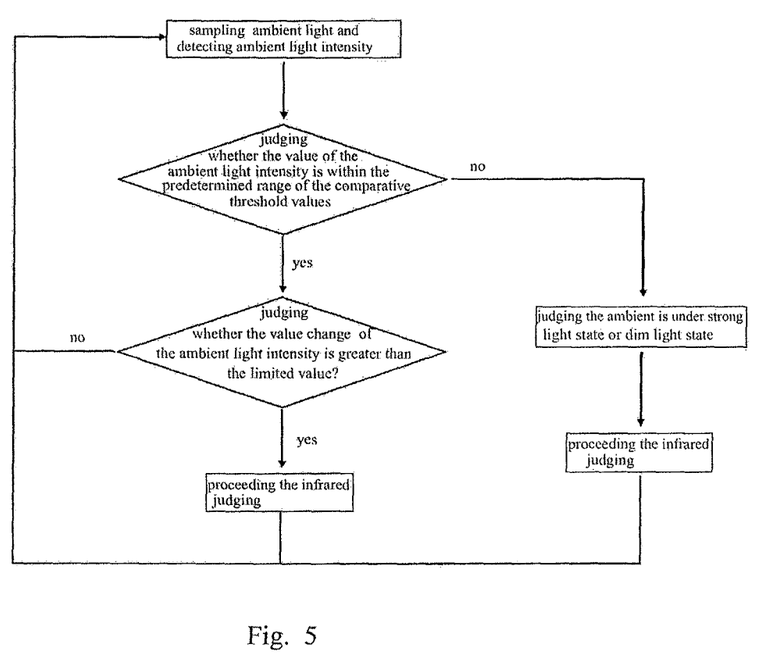
FIG. 5 is a flow chart of another exemplary automatic detecting method of the present invention.

Referring now to the flow chart of FIG. 5, an automatic detection method (e.g., for operation by the system of FIG. 1) is shown, according to another exemplary embodiment. In FIG. 5, the process adds steps intended to help the automatic sensing system work effectively under a dim light condition (at night) or a strong light condition. In the first step of the process of FIG. 5, the ambient light is sampled and the value of the ambient light intensity is detected. The ambient light sensor 1 may sample the ambient light at regular time intervals and send the voltage value corresponding to ambient light to controller 3 to be processed by the current-voltage transferring device. The controller 3 may use the received voltage values to determine a value of the ambient light intensity. The predetermined time interval T1 for detecting the ambient light intensity may be 0.3 seconds.

In the second step of FIG. 5, it is judged whether the value of the ambient light intensity is within the predetermined range of comparative threshold values. If the ambient light intensity goes beyond the range of the predetermined comparative threshold values, the procedure enters the third step. If the ambient light intensity is within the predetermined range of threshold values, the procedure enters the fourth step.

In embodiments where the predetermined range of comparative threshold values is defined by P2, P1, wherein P1 is the first comparative threshold value and P2 is the second comparative threshold value, said first comparative threshold value P1 may be 80% of the highest voltage value of the circuit and the second comparative threshold value P2 may be 20% of the highest voltage value of the circuit.

In the third step, the controller compares the value of the ambient light intensity with the predetermined first and second comparative threshold values P1 and P2. If the controller determines that the value of ambient light intensity is not within the predetermined range of comparative threshold values, the controller may then judge whether the ambient light is in a dim light state or a strong light state.

When the ambient light intensity is greater than the first comparative threshold value P1, the ambient light may be judged as in the strong light state, and then the infrared sensor 2 is started for making infrared judgments. The judgment frequency in the strong light state mode may be set to be greater than or equal to the normal working frequency. For example, in the strong light state mode, the time period for the infrared judgment is 60 seconds and the judgment frequency is once every 0.2 seconds. In another example, in strong light state mode, the time period for the infrared judgment is 60 seconds and the judgment frequency is once every 0.3 seconds.

When the ambient light intensity is less than the comparative threshold value P2, the ambient light may be judged as in the dim light state, and then the infrared sensor 2 is started for making infrared judgments. The judgment frequency in the dim light state mode may be set to be less than the normal working frequency. For example, in the dim light state mode, the time period for the infrared judgment is 60 seconds and the judgment frequency is once every 0.5 seconds. In another example, the judgment frequency could be once every 0.8 seconds. In yet another example, the judgment frequency is once every 0.5 second to every 1 second.

In the step where the controller judges whether the value change of the ambient light intensity is greater than predetermined limited value change, if the value change of the ambient light intensity is greater than the predetermined limited value change, the procedure enters the fifth step and the infrared sensor is started. If the value change of the ambient light intensity is not greater than the predetermined limited value change, the procedure returns to the first step to sample the ambient light and detect ambient light intensity over again.

The predetermined limited value change of the ambient light intensity may be K. If two continued value changes of the ambient light intensity are greater than the predetermined limited value change K, it may be judged that there is sudden changed signal, causing the procedure enters the fifth step. If the two continued value changes of the ambient light intensity are not greater than the predetermined limited value change K, it may be judged that there is no sudden changed signal and then the procedure may return to the first step to sample the ambient light and detect ambient light intensity over again. In one of the preferred embodiments, said predetermined limited value change K is 5%.

The above-mentioned value change of the ambient light intensity may be the value change between two continuously detected values of the ambient light intensity. In other embodiments of the present invention, the judgment of the value change of the ambient light intensity is based on the judgment of value change of the ambient light intensity over an interval of time, such as judging the value change of the ambient light intensity sampled at one time of interval, two times of intervals or several sampling periods.

Starting the infrared sensor 2 can include changing the infrared sensor 2 to a working state from a resting state. In an exemplary embodiment, the time period for making the infrared judgment is 2 seconds and the working frequency is once every 0.3 seconds. While making the infrared judgment, if it is detected that no user enters the detected area in the regulated judgment time period, the infrared judgment stops, and the procedure returns to the first step to make ambient light detecting over again. If it is detected that the user enters the detected area, the related equipment is controlled to operate (e.g., causing the opening or closing of the valve of the faucets). After the equipment operation is completed, the infrared judgment stops, and the procedure returns to the first step to make ambient light intensity detecting over again.

Figure 6:
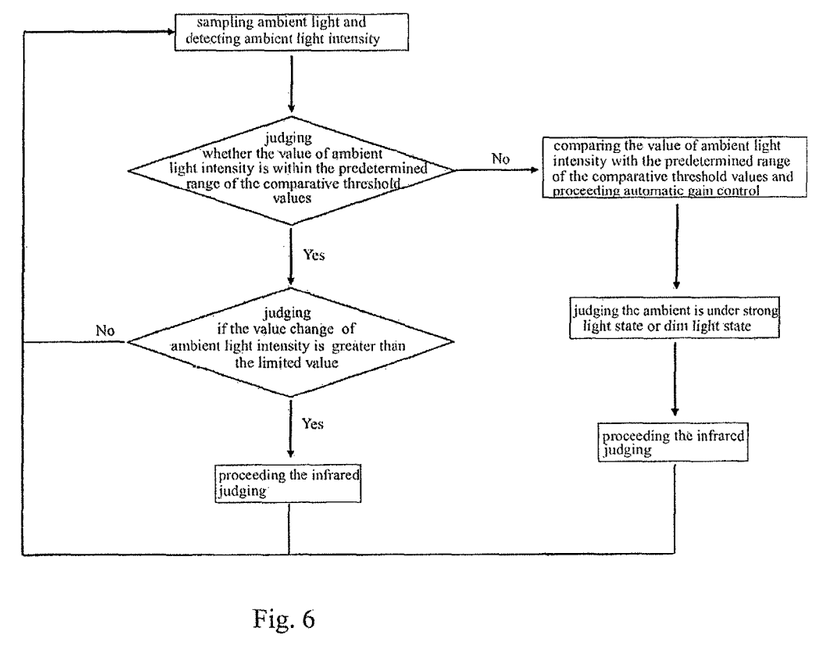
FIG. 6 is a flow chart of another exemplary automatic detecting method of the present invention.

Referring now to the flow chart of FIG. 6, an automatic detection method (e.g., for operation by the system of FIG. 1) is shown, according to another exemplary embodiment. Relative to the previous processes, FIG. 6 includes automatic gain adjustment steps. In the first step of FIG. 6, the ambient light is sampled and the value of the ambient light intensity is detected. Said ambient light sensor 1 may sample the ambient light at regular time intervals, and sends the voltage value corresponding to ambient light intensity to controller 3 to be processed by the current-voltage transferring circuit. The controller 3 may use the received voltage value to determine the value of the ambient light intensity. The predetermined time interval T1 for detecting the ambient light may be 0.3 seconds.

In the second step, it is judged whether the ambient light intensity is within the predetermined range of comparative threshold values. If the ambient light intensity is within the range of the predetermined comparative threshold values, the procedure enters the third step. If the ambient light intensity is within the predetermined range of comparative threshold values, the procedure enters the fourth step. The predetermined range of comparative threshold values may be defined by P1, P2, wherein P1 is the first comparative threshold value and P2 is the second comparative threshold value. Comparative threshold value P1 may be 80% of the highest voltage value of the circuit and the second comparative threshold value P2 may be 20% of the highest voltage value of the circuit.

In the third step, comparing the ambient light intensity with the first and second comparative values P1 and P2, automatic gain adjustment may be performed.

When the ambient light intensity is greater than the first comparative threshold value P1, it is judged whether the gain control is already set to a lowest level. If the gain control is not already on the lowest level, the gain control is lowered by one level. If the gain control is on the lowest level, the ambient light is judged as under the strong light state and then the infrared sensor 2 is started for making infrared judgments. The judgment frequency in the strong light state mode may be greater than or equal to the normal working frequency. For example, under strong light mode, the time period for making the infrared judgment may be 60 seconds, and the judgment frequency may be once every 0.2 seconds. In another example, in strong light state, the time period for the infrared judgment is 60 seconds, the judgment frequency is once every 0.3 seconds.

In an exemplary embodiment, after the gain control is lowered by one level, the procedure directly returns to the first step to sample the ambient light and detect ambient light intensity over again. In another exemplary embodiment, after the gain control is lowered by one grade, the infrared sensor may be started for making the infrared judgments. The time period for the infrared judgment after a lowering of the gain control level may be 2 seconds and the judgment frequency may be once every 0.3 seconds.

When the ambient light intensity is less than the second comparative threshold value P2, it may be judged whether the gain control is on the highest level. If the gain control is not on the highest level, the gain control is increased by one level. If the gain control is on the highest level, the ambient light is determined to be in the dim light state, and then the infrared sensor is started for making infrared judgments. In the dim light state, the judgment frequency may be less than the normal working frequency. In an exemplary embodiment, the time period for making the infrared judgment is 60 seconds and the judgment frequency is once every 0.5 seconds. In another embodiment, the judgment frequency could be once every 0.8 seconds. In yet another embodiment, the range of the judgment frequency is between 0.5 seconds and 1 second.

In an exemplary embodiment, after the gain control is increased by one level, the procedure directly returns to the first step to sample the ambient light and detect ambient light intensity over again. However, in another embodiment, after the gain control is increased by one level, the infrared sensor may be started for making infrared judgment. The time period for making the infrared judgment may be 2 seconds, and the judgment frequency may be once every 0.3 seconds.

The judgment frequency in the dim light state may be lower than the normal working frequency. In dim light state, it is highly possible that it is at night or in dark state. In this situation, the equipment is not used very often, so the judgment frequency may be lowered to reduce energy consumption. The judgment frequency in strong light state mode may be higher than the normal working frequency. Increasing the judgment frequency in strong light state mode is intended to make the judgment more precise.

In the fourth step of FIG. 6, it is judged whether the value change of the ambient light intensity is greater than the predetermined limited value change. If the value change of the ambient light intensity is greater than the predetermined limited value change, the procedure enters the fifth step, and the infrared sensor 2 is started for making infrared judgments. If the value change of the ambient light intensity is not greater than the predetermined limited value change, the procedure returns to the first step to sample the ambient light and detect ambient light intensity over again.

The predetermined limited value change of the ambient light intensity may be K. If two consecutive value changes of the ambient light intensity are greater than K, it may be judged that there is sudden changed signal, causing the procedure to enter the third step. If two consecutive value changes of the ambient light intensity are less than K, it may be determined that there is no sudden changed signal and then the procedure may be caused to return to the first step to sample the ambient light and detect ambient light intensity over again. The predetermined limited value change K may be 5%. In other embodiments, the judgment of the value change of the ambient light intensity may be based on value changes within a period of time interval (e.g., judging the value changes sampled within one time of interval, two times of intervals or several sampling periods, etc.).

The fifth step of FIG. 6 is to start infrared judgment and detect the target. Starting the infrared sensor 2 may include changing the infrared sensor 2 changes to a working state from a resting state. The time period for making the infrared judgment may be 2 seconds and the working frequency may be once every 0.3 seconds.

While making the infrared judgment, if it is detected that no user has entered the detected area within the regulated judgment time period, the infrared judgment stops, and the procedure returns to the first step to make ambient light detecting over again. If it is detected that the user has entered the detected area, the equipment is controlled to operate (e.g., opening or closing the valve of the faucet). After the operation is completed, the infrared judgment stops, and the procedure returns to the first step to make ambient light intensity detecting over again.

As shown in FIG. 7a, when the judgment is not disturbed by other lights, the voltage value corresponding to the sampled ambient light is smooth. As shown in FIG. 7b, when the judgment is disturbed by other lights, the voltage value corresponding to the sampled ambient light is fluctuating. Such fluctuations can lead to incorrect ambient light judgments. FIG. 8 illustrates an exemplay process for reducing the negative effects of such fluctuations caused by industrial frequency lighting (e.g., fluorescent lamps). Referring now to FIG. 8, the first step is to sample the light intensity N times at even time intervals over the time period of T/2. Often the disturbing period T of the industrial frequency is the half-wave time of the industrial frequency (for example: 50 Hz/60 Hz). Within the time period of T/2, the ambient light intensity may be sampled for N times at the even time interval. In an exemplary embodiment, N is 5.

Referring now to the second step of the process of FIG. 8, the relative fluctuation value $\Delta V$ of the sampled ambient light intensity is calculated. In an exemplary embodiment, the formula $\Delta V=(Vmax-Vmin)/((Vmax+Vmin)/2)$ is used to calculate fluctuation value $\Delta V$. Vmax and Vmin may be set to be the highest and the smallest value of the voltage of the ambient light intensity within the T/2 time period.

In the third step, it is judged if the relative fluctuation value $\Delta V$ in less than the predetermined limited value W. If the relative fluctuation value $\Delta V$ is less than the predetermined limited value W, it is judged that there is no disturbance of the industrial frequency lights and the procedure enters the fourth step. If the relative fluctuation value $\Delta V$ is not less than the predetermined limited value W, it is judged that there is disturbance of the industrial frequency lights and the procedure enters the fifth step. In an exemplary embodiment, W is set to be 3%. In the fourth step, the average value of the above-mentioned N samples is used as the output of the ambient light intensity. In the fifth step, the ambient light intensity is sampled for N times at the same time interval, and the average value obtained by the above-mentioned 2N times of sampling is used as the output of the ambient light intensity.

Referring again to FIG. 1, the following is the illustrative description where the automatic sensing system of an exemplary embodiment is used with a faucet. The ambient light sensor 1 and infrared sensor 2 of the automatic sensing system 100 of the present invention may be installed on the faucet body. Controller 3 is connected to ambient light sensor 1 and infrared sensor 2 to control the water discharging valve of the faucet. The ambient light sensor 1 may be positioned beside the outlet of the faucet to detect the value changes of the ambient light intensity under the faucet. Infrared sensor 2 may be set at the base or the outlet of the faucet to detect whether the target (user's hands) enters or leaves the detected area.

When a user approaches the faucet to use it, the ambient light under the outlet of the faucet will be changed. When the ambient light sensor 1 detects that the value change of the ambient light intensity is greater than the predetermined limited value, the infrared sensor 2 is started or changes to the working state from resting state. As the user's hands enter the detected area of infrared sensor 2, the controller 3 opens the solenoid valve of the faucet to discharge water. The controller 3 closes the solenoid valve of the faucet to stop the water after the infrared sensor 2 detects that user's hands have left the detected area. Afterwards, the infrared sensor 2 is stopped or changes to resting state from working state. When the ambient light sensor 1 detects that the ambient light is under the dim light or strong light state, infrared sensor emits infrared light on depending on the presets corresponding with the specific states and according to the procedures described above.

According to varying exemplary embodiments, the automatic sensing system described herein may be used with urinals, toilets or other equipments in the kitchen or washroom.

The ambient light judged by the ambient light sensor 1 could be within the same area as that the area judged by the infrared sensor 2 or the ambient light sensor 1 could be used to judge the ambient light in a different area.

Starting the infrared sensor 2 can include changing the infrared sensor 2 from non-working state to working state or from resting state to working state. Infrared sensor 2 is still working under resting state but the infrared emitting frequency is lower than normal. In some situations, the ambient light sensor 1 might not normally work because it is blocked by foreign matter, or the change of the ambient light may be too small for detection in some environments. Accordingly, in some embodiments, when the infrared sensor 2 is in the resting state and detects that the target enters the detected area, the controller then causes infrared sensor 2 to enter the normal working state from the resting state and to emit infrared light at the normal working frequency (such as emitting once every 0.3 seconds). The controller also proceeds with operation of the faucet. After the above-mentioned situation occurs two or more consecutive times, the infrared sensor 2 enters the normal working state until it is determined that the user has left the detected area and that the ambient light sensor 1 works normally. Embodiments of the present invention therefore include a process for compensating for the system malfunction and are now described in greater detail.

When it is detected by the ambient light sensor 1 that the ambient light does not change or the value change of the ambient light intensity is less than the predetermined limited value, and the infrared sensor 2 that is under the resting state detects and finds the target, the infrared sensor 2 is caused to begin emitting infrared light at normal working frequency. When the above-mentioned situation appears for N consecutive times (N is greater than 1), the controller causes the infrared sensor 2 to continue emitting infrared light at the normal working frequency. N may be equal to 2. The predetermined limited value change of the ambient light intensity K may be 5%. When it is judged that the ambient light sensor 1 detects and finds the ambient light changes and the value change of the ambient light intensity is greater than the predetermined limited value change, the ambient light sensor 1 may be inferred to be working well. Therefore, the infrared sensor 2 can refrain from continuously emitting infrared light at the normal working frequency. The controller can follow the normal procedure and start the infrared sensor depending on the value change of the ambient light intensity detected by the ambient light sensor 1.

The infrared sensor 2 in above embodiments could be replaced by a microwave sensor, an ultrasonic sensors, or another sensor which could detect the targets that enter the detected area. When the ambient light sensor detects that the ambient light intensity changes and the value change is greater than the predetermined limited value change, the microwave sensor is started or changes from resting state to working state to detect whether the target enters the detected area. If the microwave sensor does not detect and find that any target enters the detected area, it is stopped or enters a resting state after a time period (such as 2 seconds). If the microwave sensor detects and finds that the target enters or leaves the detected area, the controller causes the solenoid valve to discharge water or close the valve to stop water. Afterwards, the microwave sensor is stopped or enters the resting state.

In this application, infrared sensors, microwave sensors, ultrasonic sensors or other sensors which could detect the target that enters the detecting area, all could be considered the "detecting sensor." "Starting" the detecting sensor means to change from a non-working state to a working state or from a resting state to a working state. The photosensitive sensors used for detecting the ambient light may be or include a photosensitive diode, a photosensitive transistor or a photosensitive resistance and all could be considered the "ambient light sensor".

Relative to making decisions based solely on the absolute value of ambient light, some embodiments of the present application advantageously make ambient light determinations using comparisons involving changes of the ambient light over time. Misjudgments may result if only absolute ambient light intensity is processed. For example, in an environment with strong ambient light, the absolute ambient light intensity detected by the ambient light sensor may always be greater than the definite value. In a dim light environment, the ambient light intensity detected by the ambient light sensor may always be less than the definite value. In embodiments of the present application, the judgments are based on the value change of the ambient light intensity. For example, as described above, when the value change of the ambient light intensity is greater than the predetermined limited value change, the detecting sensor may be started regardless of the absolute value of the ambient light. In other embodiments, the judgment regarding whether to start or stop the infrared sensor may be made based on both the absolute value of the ambient light intensity and the value change of the ambient light intensity. For example, when the absolute ambient light intensity is within the range of the comparative threshold values and the value change of the ambient light intensity is greater than the predetermined limited value change, the system can start the infrared sensor (i.e., the detecting sensor) for detection. In some alternative embodiments, when the value change of the ambient light intensity is greater than a predetermined limited value change and the ambient light intensity is within a certain threshold range at the same time, the controller can skip the infrared detecting step and determine that the equipment in the kitchen or washroom is in use.

What is claimed is:

1. A system for use with a plumbing fixture, comprising:
an ambient light sensor configured to detect ambient light intensity around the plumbing fixture;
a detecting sensor for detecting a user near the plumbing fixture;
a controller in communication with the ambient light sensor and the detecting sensor, the controller configured to control the fixture based on signals from the detecting sensor;
wherein the controller adjusts the frequency of samples conducted by the detecting sensor in response to changes in the ambient light intensity detected by the ambient light sensor;
wherein the controller is configured to hold the sampling frequency at a high level for a period of time (a) after consecutive detections of a user based on the detecting sensor, and (b) before processing the ambient light intensity indicates that a user might be present.

2. The system of claim 1, wherein the detecting sensor is an infrared sensor.

3. The system of claim 2, wherein the detecting sensor comprises an infrared emitting unit which emits infrared light to the detected area and an infrared receiving unit which receives the reflected infrared signals.

4. The system of claim 1, further comprising: a current-voltage transferring circuit connected with the ambient light sensor, wherein the current-voltage transferring circuit is configured to output electrical voltage to the controller in response to current received from the ambient light sensor.

5. The system of claim 4, wherein the current-voltage transferring circuit further comprises an operational amplifier for providing the voltage and a capacitance which is in parallel to the operational amplifier to prevent self-oscillation of the current-voltage transferring circuit.

6. The system of claim 1, wherein the controller causes the frequency of the samples conducted by the detecting sensor to increase in response to an ambient light intensity change that indicates that a user has neared the plumbing fixture.

7. The system of claim 1, wherein the controller causes the frequency of the samples conducted by the detecting sensor to decrease in response to ambient light intensity that indicates an unoccupied area around the plumbing fixture.

8. The system of claim 1, wherein the controller normally causes the detecting sensor to sample for the user at a first sampling rate, and wherein adjusting the frequency of the samples conducted by the detecting sensor comprises increasing the sampling frequency relative to the first sampling rate.

9. The system of claim 1, wherein the ambient light sensor is a passive photosensitive diode.

10. The system of claim 1, wherein the controller is configured to adjust the sampling period used for detection of the ambient light intensity in response to a determination by the controller that the ambient light is fluctuating.

11. The system of claim 1, wherein the controller is configured to distinguish between a strong and a dim ambient light state, and wherein the controller is configured to adjust the frequency of the samples conducting by the detecting sensor depending on whether the strong or dim ambient light state is detected.

12. The system of claim 1, wherein the controller is configured to automatically adjust a gain for processing signals from the ambient light sensor in response to a comparison of samples from the ambient light sensor to at least one threshold value.

13. A method for use with a plumbing fixture, comprising:
detecting ambient light intensity around the plumbing fixture;
adjusting a sampling rate of an user detection sensor in response to a detected change in the ambient light intensity.

14. The method of claim 13, wherein the detection of ambient light comprises processing signals from a passive photosensitive diode.

15. The method of claim 14, wherein the user detection sensor is an active infrared sensor.

16. The method of claim 15, wherein adjusting the sampling rate of the user detection sensor comprises increasing the sampling rate when the ambient light intensity change indicates that a user is nearing the plumbing fixture.

17. The method of claim 16, wherein increasing the sampling rate when the ambient light intensity change indicates that the user is nearing the plumbing fixture comprises increasing the sampling rate in response to a reduction in ambient light intensity.

18. The method of claim 16, wherein increasing the sampling rate when the ambient light intensity change indicates that the user is nearing the plumbing fixture comprises increasing the sampling rate in response to an increase in ambient light intensity.

19. The method of claim 13, wherein the method further comprises:
automatically adjusting a gain for processing the ambient light intensity in response to a comparison of the ambient light intensity to a threshold.

* * * * *